United States Patent [19]
Kato et al.

[11] Patent Number: 5,747,743
[45] Date of Patent: May 5, 1998

[54] COIL-SHAPED FLEXIBLE PRINTED CIRCUIT BOARD

[75] Inventors: Miki Kato; Yukinori Tamano, both of Kariya; Katsumi Kobayashi, Anjo; Michiyuki Noba, Toyota, all of Japan

[73] Assignee: Nippondenso Co., Ltd., Kariya, Japan

[21] Appl. No.: 382,590

[22] Filed: Feb. 2, 1995

[30] Foreign Application Priority Data

Feb. 4, 1994 [JP] Japan ................. 6-012394
Oct. 20, 1994 [JP] Japan ................. 6-255482

[51] Int. Cl.$^6$ ........................................... H05K 1/00
[52] U.S. Cl. ................................................. 174/254
[58] Field of Search ........................ 174/255, 254, 174/250, 117 F, 117 FF, 268; 361/749; 439/67, 77

[56] References Cited

U.S. PATENT DOCUMENTS

| | | | |
|---|---|---|---|
| 3,300,572 | 1/1967 | Dahlgren et al. | 174/69 |
| 4,376,927 | 3/1983 | McGalliard | 337/297 |
| 4,381,420 | 4/1983 | Elliott et al. | 174/34 |
| 4,509,109 | 4/1985 | Hansen | 363/126 |
| 4,783,359 | 11/1988 | Fleischer et al. | 428/209 |
| 4,798,918 | 1/1989 | Kabadi et al. | 174/36 |
| 4,845,311 | 7/1989 | Schreiber et al. | 174/36 |
| 5,211,128 | 5/1993 | Katoh et al. | |
| 5,220,488 | 6/1993 | Denes | 361/398 |
| 5,372,087 | 12/1994 | Kato et al. | |

FOREIGN PATENT DOCUMENTS

| | | | |
|---|---|---|---|
| 1862429 | 11/1962 | Germany . | |
| 6-66601 | 3/1994 | Japan . | |
| 6-231621 | 8/1994 | Japan | 174/117 FF |
| 9222422 | 12/1992 | WIPO . | |

OTHER PUBLICATIONS

Patent Abstract of Japan, vol. 13, No. 99 (3447) Mar. 1989 re JP-A 63 273390.

*Primary Examiner*—Bot L. Ledynh
*Assistant Examiner*—Kristina Soderquist
*Attorney, Agent, or Firm*—Cushman Darby & Cushman IP Group of Pillsbury Madison & Sutro LLP

[57] ABSTRACT

A coil-shaped flexible printed circuit board retains its original outer diameter unchanged without any guide or retainer. For this purpose, either the conductive pattern of copper or synthetic base material is processed to have a permanent stretch before or when the board is wound into a coil shape. A squeezing step may be employed to generate the permanent stretch on the conductive pattern. Alternatively, a heat treatment of the base material may be used to form an additional bridged ingredient after the board has been wound. The additional bridged ingredient may retain the coil shape unchanged for a long time without guiding pieces.

12 Claims, 6 Drawing Sheets

COIL-SHAPED FLEXIBLE PRINTED CIRCUIT BOARD

CROSS REFERENCE TO RELATED APPLICATION

This application is based on and claims priority from Japanese Patent Applications No. Hei 6-12394 filed on Feb. 4, 1994 and No. Hei 6-255482, filed on Dec. 20, 1994, the contents of which are incorporated herein by reference.

BACKGROUND OF THE INVENTION

1. Field of the Invention

The present invention relates to a coiled flexible printed circuit board (hereafter, FPC) used for supplying electric current to the self-illuminating pointer of meters for vehicles, etc., and the manufacturing method for the FPC.

2. Related Art

In the FPC used for connection of various electric circuits, a circuit pattern is formed on a flat base layer of a synthetic resin film by means of evaporation or etching, etc., and a synthetic resin insulation layer is formed to cover on the circuit pattern by means of printing, etc.

Meters having a rotatable pointer for the automobile such as speedometers, etc. in which a self illuminating element is used have been developed. With this type of conventional meter, a hair-spring has been used for supplying electric power to the pointer. Japanese Patent Application Laid Open No. 4-224413, proposed that a coiled FPC be disposed around the pivotal axis of the pointer to supply the illuminating element with electric power. In this prior art, a flat FPC is coiled and disposed around the pivotal axis of the pointer and held temporarily before being fixed in place, and then the outer end portion of the FPC is connected and secured to a terminal board of the meter so that the coiled FPC may retain a set configuration when the temporary fixing is released. However, the FPC has a certain spring elasticity to rewind itself, and, therefore, the set coil shape cannot be maintained by itself. Thus, a guide member is placed on the outer circumference of the coil-shaped FPC so that the coil-shaped FPC may be guided and retained in contact with this guide member.

As a result, when the pointer rotates, friction occurs between the guide member and coil-shaped FPC. This causes a problem of wear to the FPC.

SUMMARY OF THE INVENTION

In view of the above problem, the present invention has a primary object to provide a FPC that can maintain a coil shape without springing back. In other words, the coil shape can be favorably retained, unchanged, even in an unconstrained state.

Another object of the present invention is to provide a permanent coil-shaped FPC compound sheet which has a synthetic resin base layer, conductive pattern formed on a base layer, and a synthetic resin insulation layer mounted to cover the pattern on the base layer.

Another object of the present invention is to provide a manufacturing method for such permanent coil-shaped FPC.

Another object of the present invention is to provide a manufacturing method for a coil-shaped FPC which comprises the steps of holding one end of the FPC, applying a press-fit load across a base layer to squeeze the FPC, reducing the press-fit load gradually as the load moves in the longitudinal direction of the FPC so that the stretch length of the conductive pattern in the FPC may decrease with the longitudinal movement, and allowing the FPC to assume a coil-shape.

A further object of the present invention is to provide a coiled FPC which retains its coil shape, even in an unconstrained state, when the FPC is set on the periphery of the pointer shaft and used to conduct power to an illuminating element of a self-illuminating pointer without any guide member.

A still further object of the present invention is to provide a coiled FPC which prevents an increase in the rotational moment or torque of the pointer and wear of the FPC caused by contacting with the guide member.

DETAILED DESCRIPTION OF THE PREFERRED EMBODIMENT

Embodiments according to the present invention will be described with reference to the drawings.

Figure 1:
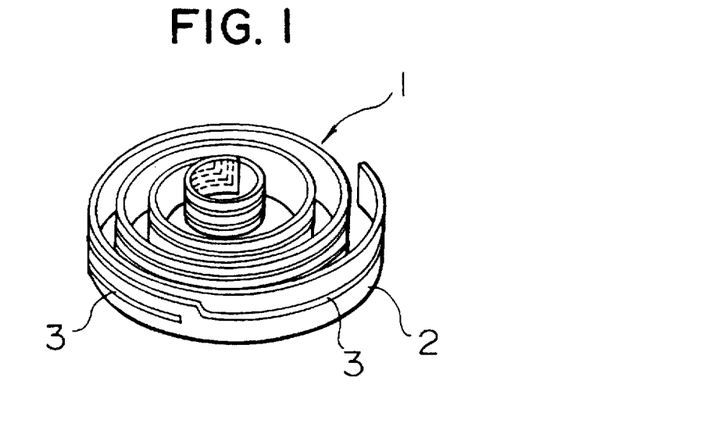
FIG. 1 is a perspective view of the FPC formed in a coil shape used as a lead wire of a self-illuminating pointer.
Figure 2:
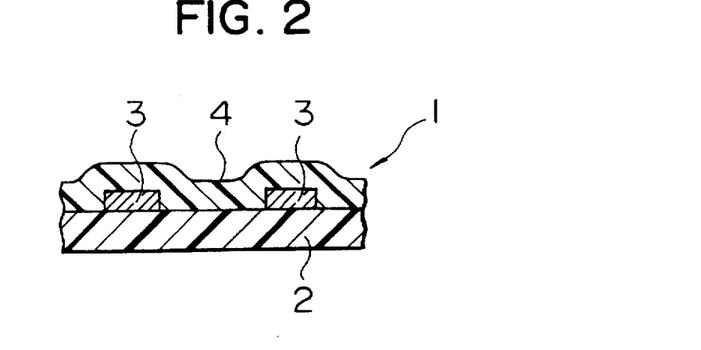
Fig. 2 is an enlarged cross-sectional view illustrating the FPC in the transverse direction.
Figure 3:
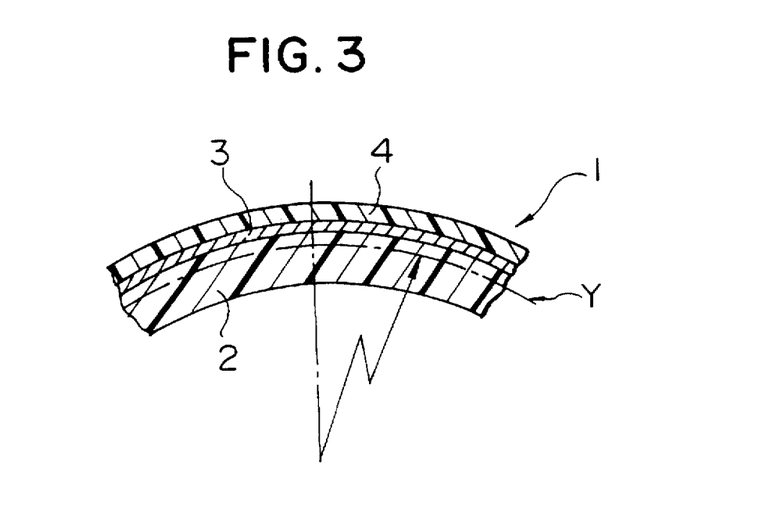
Fig. 3 is an enlarged cross-sectional view illustrating the FPC in the longitudinal direction.

As shown in the enlarged cross-sectional view in FIG. 2, a coil-shaped FPC 1 has two conductive patterns 3 formed on a synthetic resin base layer 2 and a synthetic insulation layer 4 mounted on the base layer 2 to cover the conductive patterns 3. The FPC 1 is formed in a coil shape having a predetermined diameter and retains the same diameter even in an unconstrained state as best illustrated in FIG. 1. In other words, the base layer 2 is made of a sheet of a synthetic resin such as polyimide, and a copper or copper alloy conductive film is formed on the base layer 2 by way of evaporation or the like, and then, any excessive portions of the film pattern are removed by means of etching, etc., to get the desired conductive patterns 3 on the base layer 2. Thereafter, an insulation layer 4 of polyimide is printed on the base layer 2 to cover the conductive patterns 3. With this type of flat-FPC, if a bending moment is applied on the base layer 2, the FPC 1 will bend as shown in FIG. 3, but, the neutral line (or, neutral plane) Y of the bending sheet is positioned in the base layer 2 and the conductive pattern is positioned at, or on the outer side (insulation layer 4 side) of, the neutral line Y.

Figure 4:
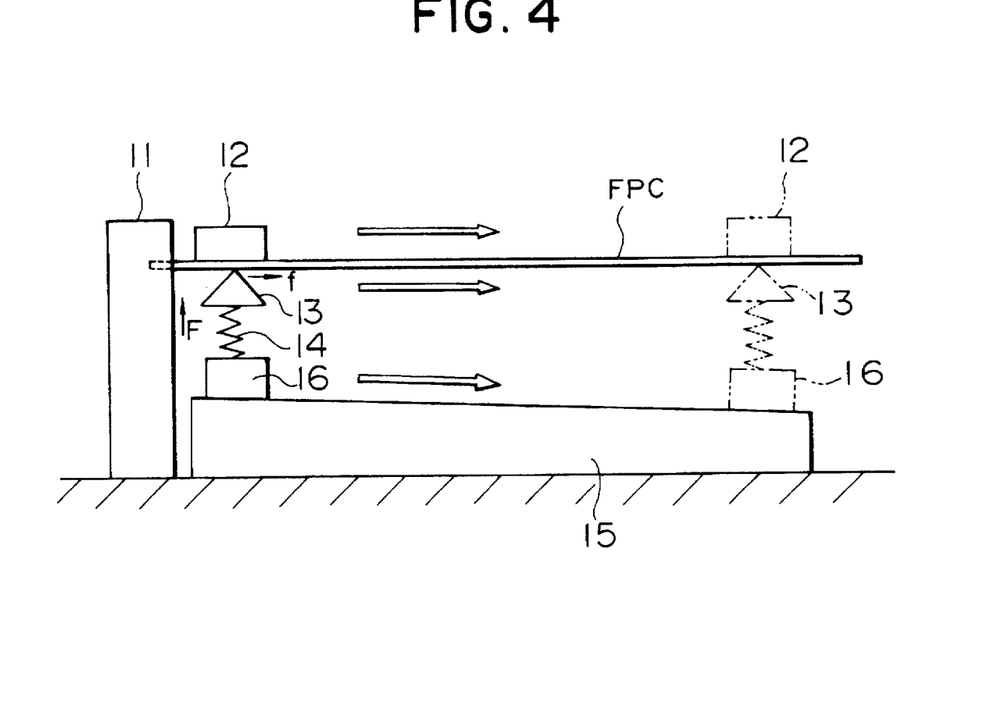
FIG. 4 is a diagrammatic front view illustrating the coil forming device.
Figure 5:
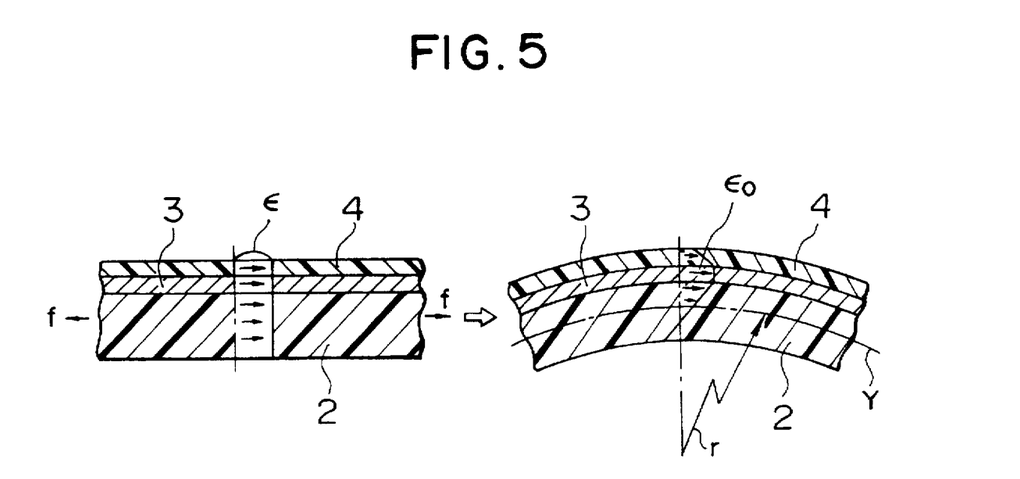
FIG. 5 is an explanatory cross-sectional view when the flat-shaped FPC is bent.
Figure 6:
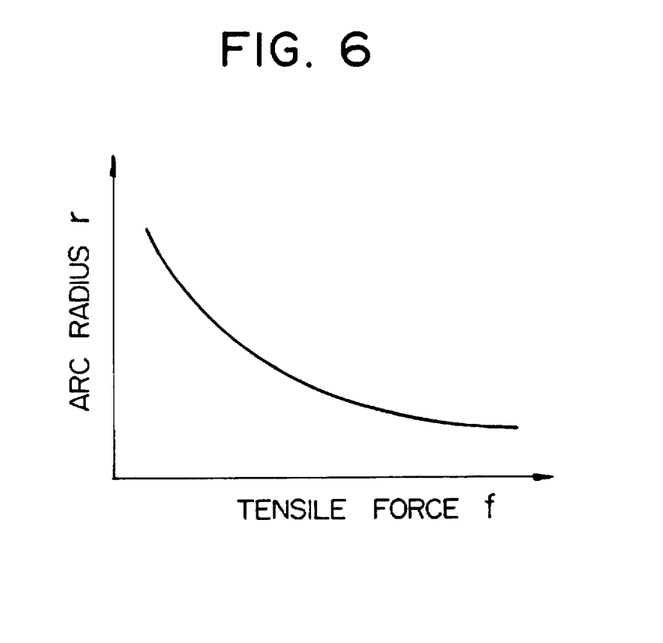
FIG. 6 is a graph indicating the relation of tensile force and bending radius.

Next, the flat-shaped FPC is formed into a coil shape by means of a coil forming device as shown in FIG. 4. This coil forming device has a catch member 11 on the left end in the Figure. The catch member 11 holds an end of the FPC. The reception jig 12 and press-fit jig 13 are set in front of the catch member 11 to sandwich the FPC and to be movable toward the right side of the Figure. The press-fit jig 13 is biased upward by a coil spring 14 so that the FPC is press-fit from below. The coil spring 14 is carried on a moving member 16 that is movable over an inclined trapezoidal platform 15 which has its base portion (left side of the Figure) being higher or broader than the other portion. With this formation, when the movable member 16 moves to the right, the biasing force of the coil spring 14 to the press-fit jig 13 decreases. The reception jig 12 is made of a hard synthetic resin such as polyacetal, and the FPC is received by its flat base from the above. The press-fit jig 13 is made of metal having a cross-section approximately in the shape of triangle. The sharp corner presses on the FPC at a press-fit load F due to the coil spring and moves in the longitudinal direction along the FPC. In the coil forming device described above, the reception jig 12 receives the pressing force of the press-fit jig 13 through the upper side of the FPC, and the reception jig 12 and press-fit jig 13 sandwich the FPC and move to the right together with the moving member 16 so as to squeeze the FPC in the longitudinal direction. At this time, the FPC receives the press-fit load F in the transverse direction from the press-fit jig 13, and receives the tensile force f in the movement direction caused by the frictional force so that the loading position, or, the position where tensile force f is applied may move in the longitudinal direction of the FPC. As a result the press-fit load F is gradually reduced and a resultant stretch in the longitudinal direction in each part of the FPC under this tensile force f gradually decreases. Since each conductive pattern 3 is positioned on the outer side of the neutral axis of the bending sheet, the FPC is formed in a coil shape as shown in FIG. 1 due to the following reasons. As shown in FIG. 5, when a tensile force f is applied on the flat-shaped FPC, a stretch ε occurs on the composite sheet including the base layer 2, conductive pattern 3 and insulation layer 4. Since the base layer 2 and insulation layer 4 stretch elastically, they return to the original shape with no deformation or strain when the tensile force f is removed. However, as the conductive patterns 3 are made of copper or copper alloy, the stretch $\epsilon_0$ remains as a permanent strain even when the tensile force f is removed. Thus, the stretch $\epsilon_0$ so on the conductive pattern prevents the return of the base layer 2 and insulation layer 4 to their undeformed states. Since the conductive patterns 3 are positioned on the outer side of the neutral line of the bending sheet, the FPC bends into an arc having its radius r as shown in FIG. 6. Since this arc radius r increases as the tensile force applied on the sheet or the strain of the sheet decreases, the FPC is formed into a small circle at first and gradually wound around the circle to be formed into a circle having a greater radius and finally is formed into a coil shape.

Figure 7:
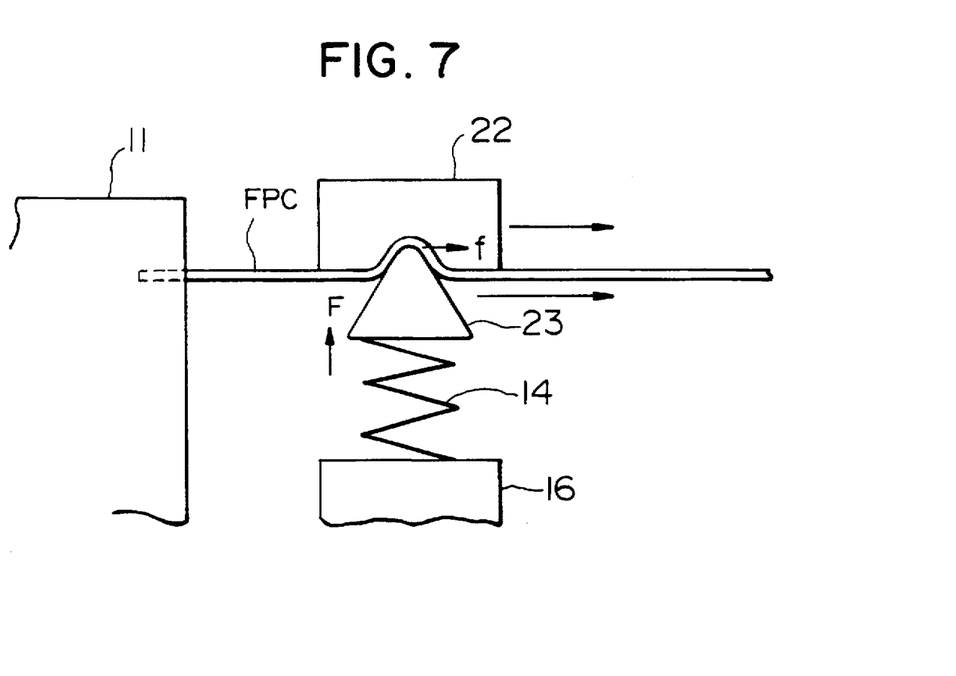
Fig. 7 is a partial front view illustrating the coil forming device of another embodiment.

FIG. 7 shows another embodiment of the coil forming device. A press-fit jig 23 of this device has a press-fit portion with a radius which is larger than the radius of said press-fit jig 13 of the first embodiment. A reception jig 22 is made of an elastically deformable material such as urethane. Thus, when the press-fit jig 23 applies the press-fit load F on the FPC from below, the FPC receives this load and bends toward the upper side. The reception jig 22 elastically deforms in a concave shape to receive this load. As with the above mentioned type of coil forming device, the reception jig 22 and press-fit jig 23 move on both sides of the FPC in the longitudinal direction with the moving member 16 to squeeze the FPC sheet under the press-fit load F gradually reducing with the movement. Thus, a greater tensile force is generated on the FPC to form a small circle at the beginning and decreasing strain is generated on the FPC to be wound around the circle to form a coil of a predetermined diameter.

Figure 8:
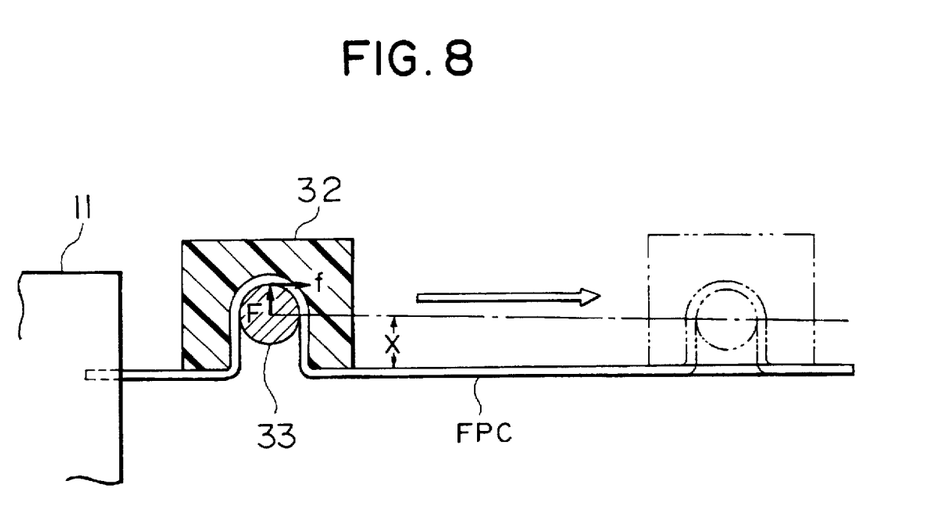
Fig. 8 is a front view including a partial cross-sectional view illustrating a main part of the coil-forming device of still another embodiment.

FIG. 8 shows still another embodiment. The press-fit jig 33 in this device is made of a metal rod, and presses a part of the FPC from below in the transverse direction at the outer circumference of the rod. The FPC is supported by a reception jig 32 from above so that the press-fit load F is applied thereon. The reception jig 32 is made of an elastically deformable material such as urethane. When the press-fit jig 33 applies a press-fit load on the FPC from below, the FPC receives this load and bends upward in an inverted U-shape. Consequently, the reception jig 32 elastically deforms in a concave shape. The reception jig 32 and press-fit jig 33 are constructed to gradually decrease the distance of the press-fit jig 33 to the flat or undeformed surface of the FPC, or in other words, displacement x shown in FIG. 8, as they move in the right direction of the Figure (longitudinal direction of FPC) so that the press-fit load F applied by the press-fit jig 33 on the FPC may gradually decrease with the movement. The technique for moving the press-fit jig 33 in this manner will be readily apparent to one skilled in the art. For example, press-fit jig 33 may be movable within an inclined tongue and groove arrangement or by an equivalent mechanism. Thus, the greater strain is generated at the left side and the smaller strain is generated at the right side of the FPC sheet in Fig.8 as described in the preceding embodiments, thereby forming a coil shape with a set diameter.

A still further embodiment is described with reference to FIGS. 9 to 13. In this embodiment, the base layer and insulation layer of the FPC made of a resinous material are heat-treated to have a semi-bridged-state therein and, then, are wound on a jig with the conductive layer on the base layer to form a coil shape and, thereafter, are heat-treated again to form bridges in the remaining non-bridged parts to get a permanent coil shape.

In other words, at the beginning the base layer 2 in a flat sheet of a synthetic resin such as polyimide, a copper or copper alloy conductive film is formed on the base layer 2 by means of evaporation or the like and any excessive film is removed by means of etching, etc., to form a desired conductive pattern or patterns 3 on the base layer 2. An insulation layer 4 made of polyimide is formed by means of printing, etc., on the base layer 2 to cover the conductive pattern 3. Then, this compound sheet is heat-treated for a period shorter than the period required to form a 100% bridge or at a temperature lower than the temperature required to form a 100% bridge.

The FPC composed of this base layer 2, conductive pattern 3 and insulation layer 4 has a flat-plate shape. In the above embodiment, both the base layer 2 and insulation layer 4 have an approximately 60 to 90% semi-bridge ingredient, but only one of the base layer 2 and insulation layer needs to have semi-bridged ingredient of approximately 60 to 90% to obtain the advantageous properties of this embodiment.

Figure 9:
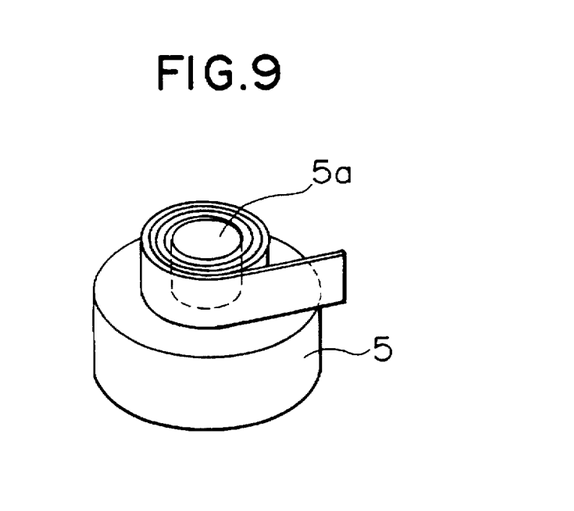
FIG. 9 is a perspective view illustrating the FPC being wound on a jig.

Next, the flat FPC of the semi-bridged ingredient is wound on a jig 5 around its center column portion projecting 5a from the base, as shown in FIG. 9. The FPC with the jig 5 is heat treated again in a heat treatment furnace, etc., to get a complete bridge or 100% bridge ingredient. Thus, the heat treatment temperature and time are adjusted so that the approximately 10 to 40% non-bridged portion may be bridged. The FPC that has been heat-treated is the coil-shaped FPC 1 shown in FIG. 1 that has a specified outer diameter dimension and that can retain the coil shape even in an unconstrained state.

Figure 10:
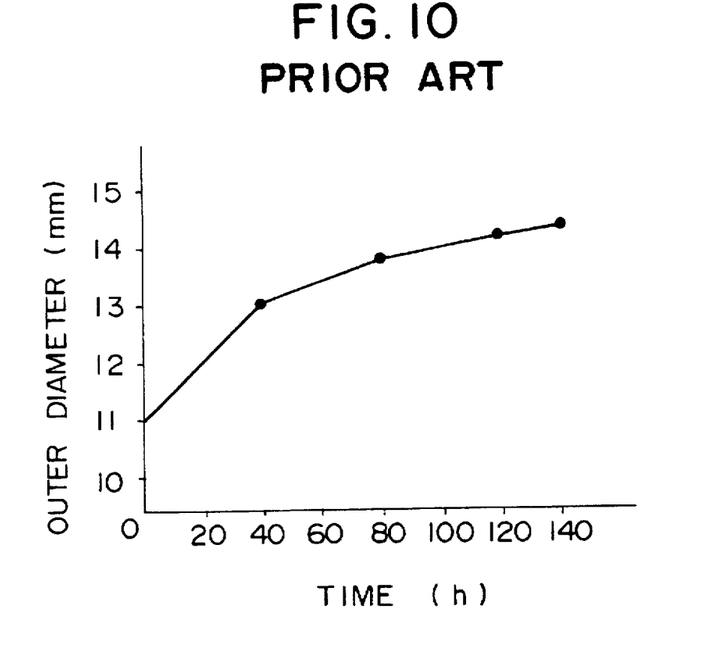
FIG. 10 is a graph indicating changes in the outer diameter of the conventional coil-shaped FPC which is heat treated again.

For comparison, FIG. 10 shows changes in the outer diameter of the conventional coil-shaped FPC manufactured in the conventional way being left in the unconstrained state. In the conventional way, a 100% bridged FPC, instead of a semi-bridged FPC, is wound and set on jig 5 as shown in FIG. 9, and placed in the heat treatment furnace again, to form a coil-shaped FPC. As shown in the graph in FIG. 10, even when the 100% bridged FPC is heat treated again, the changes in the outer diameter of the coil-shaped FPC are significant.

The reason for this is explained below. Since the FPC is a compound body composed of a copper conductive pattern, synthetic resin base layer and insulation layer, the physical characteristics of the copper and those of the synthetic resin are different.

Figure 11:
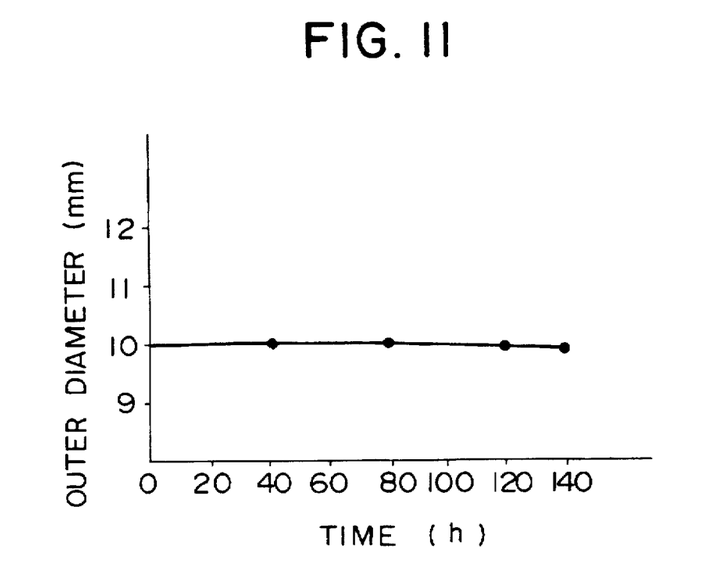
FIG. 11 is a graph indicating changes in the outer diameter of a copper plate coil-shaped body.
Figure 12:
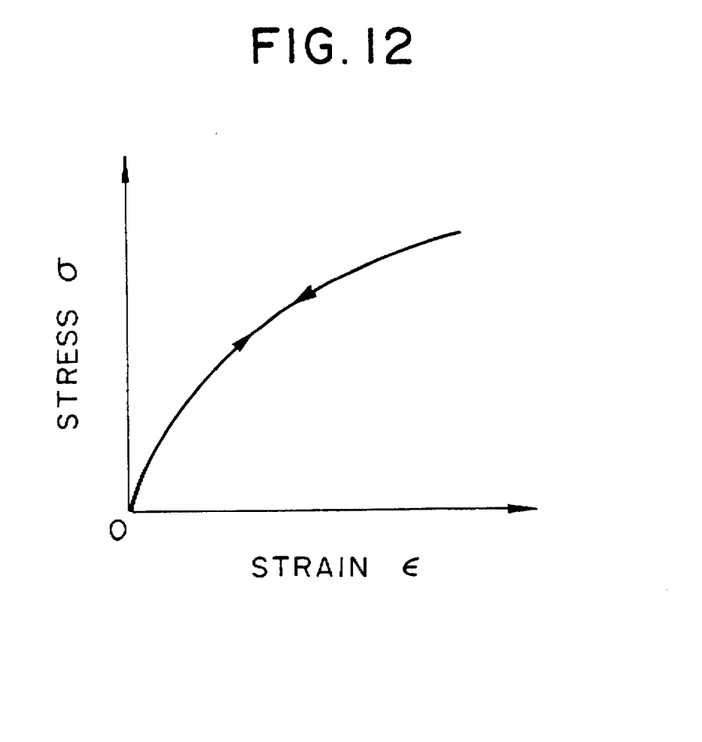
Fig. 12 is a graph indicating the stress-strain curve of polyimide sheet.
Figure 13:
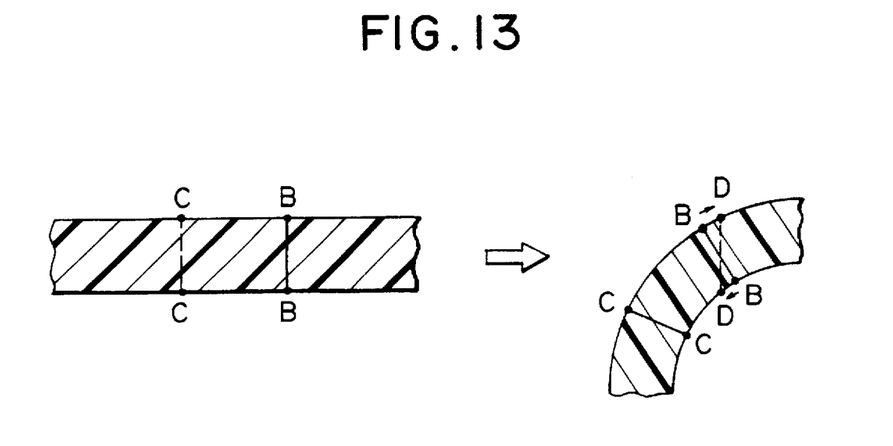
FIG. 13 is an explanatory drawing indicating stress when polyimide sheet is bent.

A coiled body is formed with a copper plate and heat-treated at approximately 260° C., then it is left in the unconstrained state to measure the changes in the outer diameter dimensions of the coil body. The changes of the outer diameter dimensions are shown in FIG. 11. From the graph in FIG. 11 it can be seen that the outer diameter of the copper plate coil body does not change very much even when left for a long time. This is because the recrystallization temperature of copper is approximately 250° C., and when it is heat-treated at a temperature higher than this, the outer diameter dimensions of the coil body are stabilized. On the other hand, the synthetic resin (polyimide) used for the base layer and insulation layer, has a stress-strain curve in the 100% bridged shape as shown in FIG. 12. The resin has a spring elasticity so that when stress is applied, the shape deforms, and when the stress is removed, the stress and strain return along the curve shown in the graph. Thus, even when a 100% bridged FPC is heat-treated again in a coil shape, the coil shape deforms in the direction to rewind or straighten the coil.

On the other hand, the FPC as in the present invention which contains a semi-bridged ingredient is formed into a coil shape and then is heat-treated again to have a fully-bridged ingredient. When a flat sheet shown in the left side in FIG. 13, in which the B—B portion was bridged and the C—C portion remained in the non-bridged state during the first heat treatment, is wound to a coil shape and, thereafter, is subject to the next heat treatment, the C—C portion of the bent FPC becomes fully bridged. Although, a stress to return to the straight in the direction of D—D occurs at the B—B portion, the coil shape may be retained unchanged, since the C—C portion acts to retain the bending stress. If one tries to bend the synthetic resin of 0% bridged ingredient into the designated coil shape before heat treatment to get the 100%-bridged ingredient, it is very difficult to provide such method because such synthetic resin is too viscous to form such coil shape. Thus, in the initial winding stage, 60 to 90% bridged material is preferably applied.

As explained above, the coil-shaped FPC (FIG. 1) having a self-retained outer diameter is set on the periphery of the pointer axis of a meter to which a self-illuminating pointer is installed. The inner side end of the FPC is connected to the illuminating element on the pointer side, and the outer side end is fixed to the terminal plate set on the outer side of the meter. Since the coil-shaped FPC 1 retains the coil shape, unchanged even in the unconstrained state, a guide member is not required. This prevents an increase of torque of the pointer rotation and wear of the FPC due to contact of the guide member with the FPC.

What is claimed is:

1. A coil-shaped flexible printed circuit board having a prescribed outer diameter comprising:

a base sheet of synthetic resin;

a conductive pattern formed on said synthetic resin base sheet for exerting a coiling force on said base sheet; and an insulation layer of synthetic resin mounted on said base sheet to cover said conductive pattern;

at least one of said base sheet, conductive pattern, and insulation layer being processed to have a retaining force after they are formed into a coil shape having a prescribed outer diameter, wherein said coiling force exerted by said conductive pattern causes said flexible printed circuit board to assume said coil shape.

2. A coil-shaped flexible printed circuit board having a prescribed outer diameter comprising:

a base sheet of synthetic resin;

a conductive pattern made of conductive material formed on said base sheet;

an insulation layer formed on said base sheet to cover said conductive pattern;

said base sheet, said conductive pattern and said insulation layer forming a compound sheet to be so arranged that a neutral line of bending of said compound sheet is placed on a side of said conductive pattern opposite said insulation layer;

said compound sheet being squeezed in the longitudinal direction to have a longer stretch at one end and a shorter stretch at the other end so that said compound sheet may wind by itself due to the residual stress of said base sheet caused by deformation of said conductive pattern after the squeeze.

3. A coil-shaped flexible printed circuit board having a prescribed outer diameter comprising:

a coiled base sheet of synthetic resin having a temperature to form a complete bridged-state therein;

a coiled conductive circuit pattern made of conductive metal formed on said base sheet for exerting a coiling force on said base sheet; and a coiled insulating layer formed on said base sheet to cover said conductive pattern;

said base sheet having been coiled when said base sheet formed semi-bridged state and subsequently heat-treated at the temperature to form a complete-bridged state after being coiled, wherein said coiling force exerted by said conductive pattern causes said flexible printed circuit board to assume said coil shape.

4. A coil-shaped flexible printed circuit board according to claim 3, wherein said coiled insulating layer has a temperature to form the complete bridged-state and previously formed semi-bridged state before being coiled and is heat-treated after being coiled together with said base sheet at said temperature to form the complete bridged state.

5. A flexible printed circuit board having a coil shape with a prescribed outer diameter, said flexible printed circuit board comprising:

a base layer;

conductive pattern means, disposed on said base layer, for conducting electricity and for exerting a bending force on said base layer; and an insulation layer disposed on a side of said conductive pattern means opposite said base layer;

whereby said bending force exerted by said conductive pattern means causes said flexible printed circuit board to assume said coil shape.

6. The flexible printed circuit board of claim 5, wherein said conductive pattern means includes a conductive pattern comprising one of copper and a copper alloy.

7. The flexible printed circuit board of claim 6, wherein said conductive pattern is a permanently deformed conductive pattern.

8. The flexible printed circuit board of claim 5, wherein said insulating layer is a synthetic resin insulating layer and said base layer is a synthetic resin base layer.

9. The flexible printed circuit board of claim 8, wherein said insulating layer is an elastically deformed synthetic resin insulating layer.

10. The flexible printed circuit board of claim 5, wherein:

said conductive pattern means exerts said bending force at a first magnitude at an end of said flexible printed circuit board proximate a center of said coil shape; and said conductive pattern means exerts said bending force at a second magnitude smaller than said first magnitude at an end of said flexible printed circuit board proximate said outer diameter.

11. The flexible printed circuit board of claim 5, wherein said flexible printed circuit board has a neutral line of bending, said conductive pattern means is disposed on said neutral line.

12. The flexible printed circuit board of claim 5, wherein said flexible printed circuit board has a neutral line of bending, said neutral line is disposed on a side of said conductive pattern means opposite said insulation layer.

* * * * *